(12) United States Patent
Lai

(10) Patent No.: US 8,513,690 B2
(45) Date of Patent: Aug. 20, 2013

(54) LIGHT EMITTING DIODE STRUCTURE HAVING TWO LIGHTING STRUCTURES STACKED TOGETHER AND DRIVEN BY ALTERNATING CURRENT

(75) Inventor: Chih-Ming Lai, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 343 days.

(21) Appl. No.: 12/941,091

(22) Filed: Nov. 8, 2010

(65) Prior Publication Data

US 2012/0025237 A1 Feb. 2, 2012

(30) Foreign Application Priority Data

Aug. 2, 2010 (TW) .................................. 99125569

(51) Int. Cl.
*H01L 33/00* (2010.01)
(52) U.S. Cl.
USPC ..................................... 257/98; 257/E33.055
(58) Field of Classification Search
USPC ................ 257/98, 99, 79, E33.062, E33.067, 257/94, 96, 97, E33.055
See application file for complete search history.

(56) References Cited

U.S. PATENT DOCUMENTS

| | | | | |
|---|---|---|---|---|
| 5,917,280 A | * | 6/1999 | Burrows et al. | 313/506 |
| 2002/0011605 A1 | * | 1/2002 | Twynam | 257/197 |
| 2004/0072383 A1 | * | 4/2004 | Nagahama et al. | 438/47 |
| 2007/0010035 A1 | * | 1/2007 | Liu et al. | 438/22 |
| 2007/0132369 A1 | * | 6/2007 | Forrest et al. | 313/503 |
| 2008/0190479 A1 | * | 8/2008 | Hsieh et al. | 136/246 |
| 2010/0084668 A1 | * | 4/2010 | Choi et al. | 257/89 |
| 2011/0068330 A1 | * | 3/2011 | Akimoto et al. | 257/40 |

* cited by examiner

*Primary Examiner* — Bilkis Jahan
(74) *Attorney, Agent, or Firm* — Altis Law Group, Inc.

(57) ABSTRACT

A light emitting diode structure includes an electrically conductive substrate, a first lighting structure having a first n-type semiconductor layer, a first active layer and a first p-type semiconductor layer and a second lighting structure having a second n-type semiconductor layer, a second active layer and a second p-type semiconductor layer. The first n-type semiconductor layer is electrically connected with the second p-type semiconductor layer and the first p-type semiconductor layer is electrically connected with the second n-type semiconductor layer. A first transparent, conductive layer is formed on the first lighting structure and a second transparent, conductive layer is formed on the second lighting structure. The first transparent, conductive layer and the second transparent, conductive layer are connected together to combine the first lighting structure with the second lighting structure.

12 Claims, 4 Drawing Sheets

LIGHT EMITTING DIODE STRUCTURE HAVING TWO LIGHTING STRUCTURES STACKED TOGETHER AND DRIVEN BY ALTERNATING CURRENT

TECHNICAL FIELD

The disclosure generally relates to light emitting diode (LED) structures, especially to an LED structure driven by alternating current (AC).

DESCRIPTION OF RELATED ART

In recent years, due to excellent light quality and high luminous efficiency, light emitting diodes (LEDs) have increasingly been used to substitute for cold cathode fluorescent lamps (CCFLs) as a light source of a backlight, and for incandescent bulbs or compact fluorescent lamps or fluorescent tubes as a light source of an illumination device.

Generally, a typical LED is driven by direct current (DC). When an LED lighting device is applied in an AC power source, a DC-AC inverter is required to turn AC to DC. Cost is added and power is loss during the inverting process. Therefore the energy converting efficiency decreases.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the LED structure will now be described in detail below and with reference to the drawings.

Figure 1:
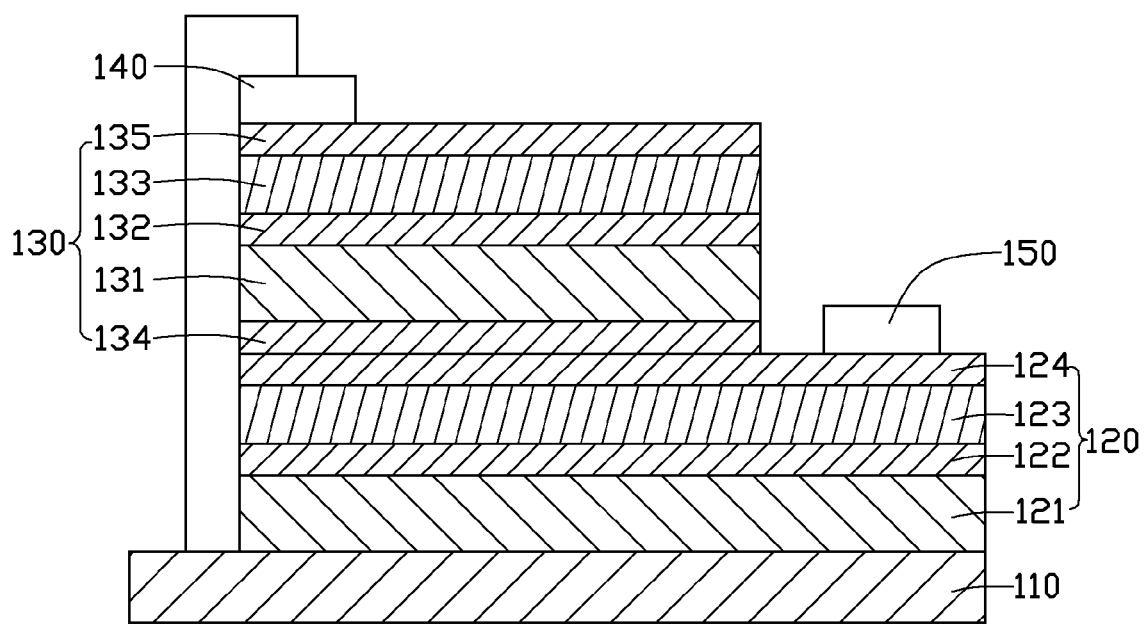
FIG. 1 is a cross-sectional view of an LED, in accordance with a first embodiment.

Referring to FIG. 1, an LED structure in accordance with a first embodiment is shown. The LED structure includes an electrically conductive substrate 110, a first lighting structure 120 formed on the electrically conductive substrate 110 and a second lighting structure 130 formed on the first lighting structure 120. Especially, the electrically conductive substrate 110 is made of metallic materials with high thermal conductivity such as copper (Cu), tungsten (W), molybdenum (Mo), aluminum (Al), gold (Au) or alloy thereof. In addition, the electrically conductive substrate 110 can also be made of semiconductor materials such as SiC, Si, GaN, GaAs or GaP.

The first lighting structure 120 includes a first n-type semiconductor layer 121, a first active layer 122 and a first p-type semiconductor layer 123 sequentially formed on the electrical substrate 110. The first n-type semiconductor layer 121, the first active layer 122 and the first p-type semiconductor layer 123 contains one or more elements selected from the group consisting of Ga, Al, In, As, P and N. For example, the material of the first lighting structure 120 can be $Al_xIn_yGa_{(1-x-y)}P$, or $Al_xIn_yGa_{(1-x-y)}As$ emitting the light with wavelength from yellow light to red light, or $Al_xIn_yGa_{(1-x-y)}N$ emitting the light with wavelength from ultraviolet radiation to blue light, wherein x is in the range from 0 to 1, y is in the range from 0 to 1 and x+y is in the range from 0 to 1. The first lighting structure 120 further includes a first transparent, conductive layer 124 formed on the first p-type semiconductor layer 123 and the thickness of the first transparent, conductive layer 124 is less than 500 nm. In this embodiment, the thickness of the first transparent, conductive layer 124 is less than 300 nm for better light extraction efficiency. The first transparent, conductive layer 124 is made of indium tin oxide (ITO) films, or indium zinc oxide (IZO) films doped with Ga, Al or In. In addition, the material of the first transparent, conductive layer 124 can also be selected from the group consisting of mixture of $In_2O_3$ and $SnO_2$, mixture of ZnO and $Ga_2O_3$, mixture of ZnO and $Al_2O_3$ and mixture of ZnO and $In_2O_3$.

The second lighting structure 130 includes a second n-type semiconductor layer 131, a second active layer 132 and a second p-type semiconductor layer 133 sequentially formed on the first lighting structure 120. The second n-type semiconductor layer 131 is adjacent to the first lighting structure 120. The second lighting structure 130 contains one or more elements selected from the group consisting of Ga, Al, In, As, P and N. For example, the second lighting structure 130 can be $Al_xIn_yGa_{(1-x-y)}P$, $Al_xIn_yGa_{(1-x-y)}$ or $Al_xIn_yGa_{(1-x-y)}N$. The second lighting structure 130 further includes a second transparent, conductive layer 134 formed on the second n-type semiconductor layer 131. The first transparent, conductive layer 124 and the second transparent, conductive layer 134 is connected together to combine the first lighting structure 120 and the second lighting structure 130. In this embodiment, the first transparent, conductive layer 124 and the second transparent, conductive layer 134 can be connected by conductive adhesive or by wafer bonding and the first transparent, conductive layer 124 is electrically connected with the second transparent, conductive layer 134. The thickness of the first light structure 120 and the second lighting structure 130 is less than or equal to 5 μm respectively. In one alternative embodiment, the thickness of the first light structure 120 and the second lighting structure 130 is less than or equal to 3 μm respectively to form micro resonance cavity structure and improve the light extraction efficiency of the LED structure.

The second lighting structure 130 further includes a third transparent, conductive layer 135 formed on the second p-type semiconductor layer 133. The light from the first active layer 122 and the second active layer 123 can emit to the environment through the third conductive layer 135. A first electrode pad 140 is formed on a top surface of the third transparent, conductive layer 135. The first electrode pad 140 is electrically connected with the electrically conductive substrate 110 by wires 111. Accordingly, the second p-type semiconductor layer 133 is electrically connected with the first n-type semiconductor layer 121. A second electrode layer 150 is formed on the first conductive layer 124. When an alternating current is applied between the first electrode pad 140 and the second electrode pad 150, the second lighting structure 130 emits light in the positive period of the current and the first lighting structure 120 emits light in the negative period of the current. That means the LED structure will emit light at any time in an alternating current. The AC LED structure has a simple manufacture process by combining two different lighting structures together and thus the cost of the AC LED structure is decreased. In alternative embodiments, the second p-type semiconductor layer and first n-type semiconductor layer can also be connected with transparent, conductive layers, and the second n-type semiconductor layer is electrically connected with the first p-type semiconductor layer by wires.

In this embodiment, the wavelength of the light emitted by the first active layer 122 is greater than that of the second active layer 132. Therefore, when the light emitted by the first active layer 122 pass through the second active layer 132, it would not be absorbed by the second active layer 132. For example, when the first active layer 122 and the second active layer 132 is made of $Al_xIn_yGa_{(1-x-y)}N$, the content of the Al in the first active layer 122 can be less than that in the second active layer 132. Therefore, the wavelength of the light emitted by the first active layer 122 will be greater than that of the second active layer 132.

Figure 2:
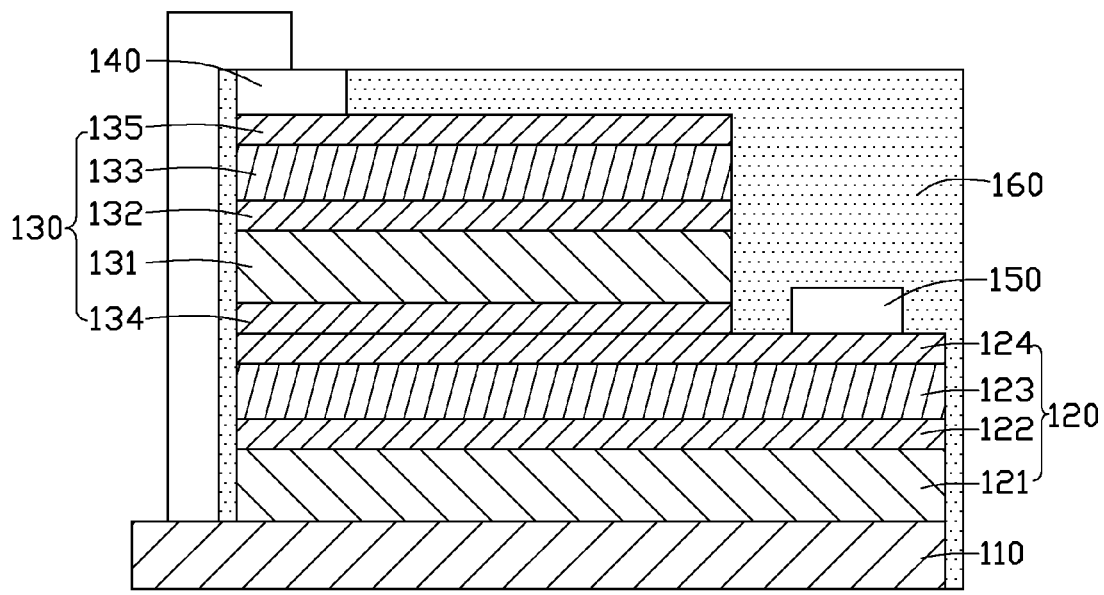
FIG. 2 is a cross-sectional view of an LED, in accordance with a second embodiment.

Referring to FIG. 2, the LED structure further includes a light conversion layer 160 formed on the exterior surface of the LED structure. The light conversion layer 160 absorbs a first light from the first lighting structure 120 or the second lighting structure 130 and emits a second light with longer wavelength than the first light. The light conversion layer 160 is made of a material selected from the group consisting of sulfides, nitrides, oxides, silicates and aluminates. Especially, the light conversion layer 160 is made of the following materials: $Ca_2Al_{12}O_{19}$:Mn, $Y_3Al_5O_{12}$:$Ce^{3+}$, $Tb_3Al_5O_{12}$:$Ce^{3+}$, $Ca_2Si_5N_8$:$Eu^{2+}$, $BaMgAl_{10}O_{17}$:$Eu^{2+}$, $Ca_aSr_bBa_{(1-a-b)}S$:$Eu^{2+}$, $(Mg_aCa_bSr_cBa_{(1-a-b-c)})_2SiO_4$:$Eu^{2+}$, $(Mg_aCa_bSr_cBa_{(1-a-b-c)})_3Si_2O_7$:$Eu^{2+}$, $Ca_8Mg(SiO_4)_4Cl_2$:$Eu^{2+}$, $(Ca_aSr_bBa_{(1-a-b)})Al_2O_4$:$Eu^{2+}$, $(Ca_aSr_bBa_{(1-a-b)})Si_xO_yN_z$:$Eu^{2+}$, $Y_2O_2S$:$Eu^{3+}$, $(Ca_aMg_bY_{(1-a-b)})Si_xAl_wO_yN_z$:$Eu^{2+}$, CdS, CdTe or CdSe.

Figure 3:
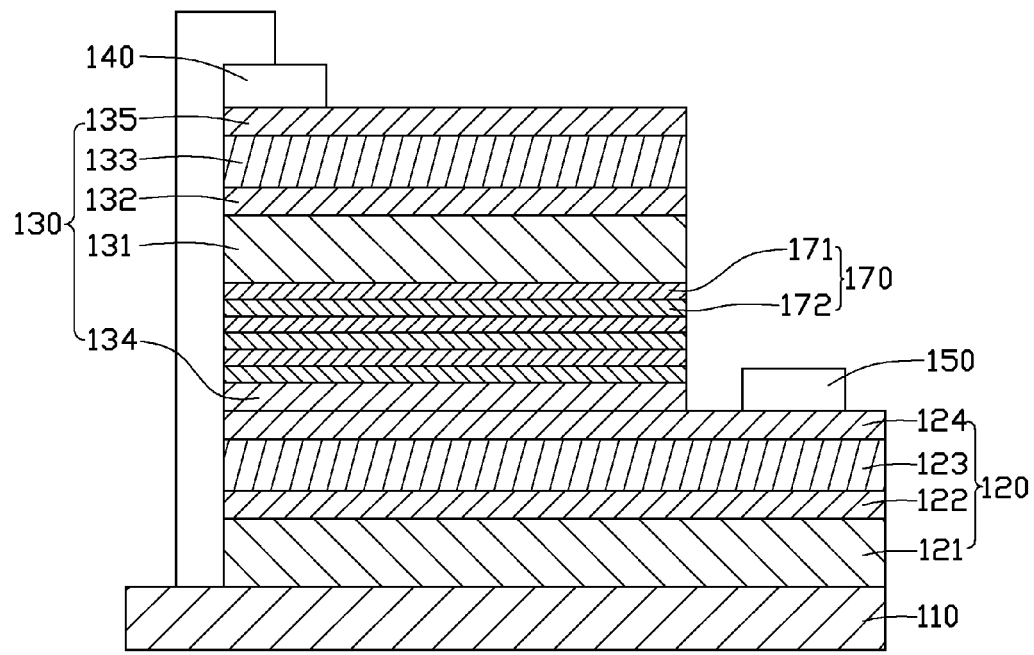
FIG. 3 is a cross-sectional view of an LED, in accordance with a third embodiment.

Referring to FIG. 3, an LED structure in accordance with a third embodiment is shown. Compared with the first embodiment, the LED structure further includes an optical adjusting layer 170 formed between the first active layer 122 and the second active layer 132. The light emitted from the first active layer 122 to the second lighting structure 130 can pass through the optical adjusting layer 170 and then emits to the environment through the second lighting structure 130. The light emitted from the second active layer 132 to the first lighting structure 120 will be reflected by the optical adjusting layer 170 and emits to the environment through the second lighting structure 130. That means the light emitted from the second active layer 132 to the first lighting structure 120 is reflected by the optical adjusting layer 170 rather than pass through the first lighting structure 120 and so the transmitting path of this part of light in the LED structure is shorten and energy loss of this part of light in transmitting is decreased. In this embodiment, the optical adjusting layer 170 includes first layers 171 and second layers 172 with a refraction coefficient different from that of the first layer 171s. The first layers 171 and the second layers 172 are alternately stacked between the second n-type semiconductor layer 131 and the second transparent, conductive layer 134. The material of the first layers 171 and the second layers 172 is adapt to the material of the second lighting structure 130. For example, when the second lighting structure 130 is made of $Al_xIn_yGa_{(1-x-y)}N$, the first layers 171 can be GaN and the second layers can be $Al_xGa_{(1-x)}N$. The thickness of each of the first layers 171 and the second layers 172 is one fourth of the wavelength of the light emitted from the second lighting structure 132. Therefore the light from the second lighting structure 132 can be efficiently reflected by the first layers 171 and the second layers 172. Because the wavelength of light emitted by the first active layer 122 is different from that of light emitted by the second active layer 132, the light from the first active layer 122 can pass through the first layers 171 and the second layers 172.

Figure 4:
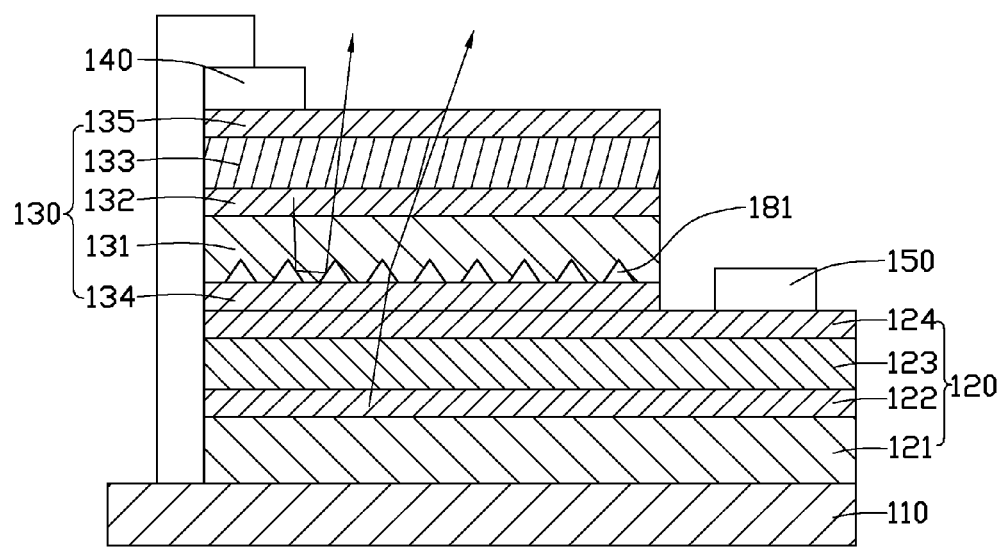
FIG. 4 is a cross-sectional view of an LED, in accordance with a fourth embodiment.

Referring to FIG. 4, an LED structure in accordance with a fourth embodiment is shown. Compared with the first embodiment, the LED structure further includes a plurality of grooves 181 form on the second n-type semiconductor layer 131. The grooves 181 are adjacent to the second transparent, conductive layer 134 and the cross section of each of the grooves 181 is triangle. FIG. 4 shows the transmitting paths of part of the light from the first active layer 122 and the second active layer 132. It can be seen that by controlling the angle of the grooves 181, the light emitted from the second lighting structure 132 will be totally reflected by the grooves 181 and then emits to the environment through the second lighting structure 130. The light from the first active layer 122 to the second lighting structure 130 can pass through the grooves 181. Therefore, the grooves 181 are another form of optical adjusting layer. The grooves 181 can be formed on the second n-type semiconductor layer 131 by etched or pressed. In addition, the grooves can be replaced by taper concaves or pyramid concaves.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A light emitting diode structure comprising:
   an electrically conductive substrate;
   a first lighting structure formed on the electrically conductive substrate, the first lighting structure including a first n-type semiconductor layer, a first active layer and a first p-type semiconductor layer;
   a second lighting structure formed on the first lighting structure, the second lighting structure including a second n-type semiconductor layer, a second active layer and a second p-type semiconductor layer, the second n-type semiconductor layer being electrically connected with the first p-type semiconductor layer and the second p-type semiconductor layer being electrically connected with the first n-type semiconductor layer;
   a first transparent, conductive layer formed on the first lighting structure; and
   a second transparent, conductive layer formed under the second lighting structure, wherein the first transparent, conductive layer and the second transparent, conductive layer being connected together to combine the first lighting structure with the second lighting structure; and wherein the first p-type semiconductor layer direct contacts with a bottom surface of the first transparent, conductive layer and a top surface of the second transparent, conductive layer directly contacts with an optical adjusting layer.

2. The light emitting diode structure of claim 1, wherein the first transparent, conductive layer and the second transparent, conductive layer are connected together by conductive adhesive.

3. The light emitting diode structure of claim 1, wherein the first transparent, conductive layer and the second transparent, conductive layer are connected together by wafer bonding.

4. The light emitting diode structure of claim 1, wherein a wavelength of the light emitted by the first active layer is greater than that of the light emitted by the second active layer.

5. The light emitting diode structure of claim 1, wherein a thickness of each of the first lighting structure and the second lighting structure is less than or equal to 3 μm.

6. The light emitting diode structure of claim 1, wherein the first transparent, conductive layer is selected from the group consisting of ITO film, ZnO film doped with Ga, Al or In, mixture of $In_2O_3$ and $SnO_2$, mixture of ZnO and $Ga_2O_3$, mixture of ZnO and $Al_2O_3$ and mixture of ZnO and $In_2O_3$.

7. The light emitting diode structure of claim 1, wherein the second transparent, conductive layer is selected from the group consisting of ITO film, ZnO film doped with Ga, Al or In, mixture of $In_2O_3$ and $SnO_2$, mixture of ZnO and $Ga_2O_3$, mixture of ZnO and $Al_2O_3$ and mixture of ZnO and $In_2O_3$.

8. The light emitting diode structure of claim 1, wherein a material of the electrically conductive substrate is selected from the group consisting of copper, tungsten, molybdenum, nickel, aluminum, gold and an alloy thereof.

9. The light emitting diode structure of claim 1 further comprising a third transparent, conductive layer formed on a top surface of the second lighting structure away from the second transparent, conductive layer.

10. The light emitting diode structure of claim 9 further comprising a first electrode pad formed on a top surface of the third transparent, conductive layer and a second electrode pad formed on the first transparent, conductive layer, wherein the first electrode pad is electrically connected with the electrically conductive substrate.

11. The light emitting diode structure of claim 1 further comprising light emitted from the first active layer to the second lighting structure passing through the optical adjusting layer and emitting to an environment through the second lighting structure, and light emitted from the second active layer to the first lighting structure being reflected by the optical adjusting layer and emitting to the environment through the second lighting structure.

12. The light emitting diode structure of claim 11, wherein the optical adjusting layer comprises a plurality of first layers and second layers, the first and second layers have different refraction coefficients, the first and second layers are alternately stacked between the first active layer and the second active layer, and a thickness of each of the first and second layers is one fourth of the wavelength of the light emitted from the second active layer.

* * * * *